United States Patent
Bukofsky et al.

(10) Patent No.: US 6,824,932 B2
(45) Date of Patent: Nov. 30, 2004

(54) SELF-ALIGNED ALTERNATING PHASE SHIFT MASK PATTERNING PROCESS

(75) Inventors: Scott J. Bukofsky, Hopewell Junction, NY (US); Carlos A. Fonseca, Staten Island, NY (US); Michael S. Hibbs, Westford, VT (US); Lars W. Liebmann, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 10/164,242

(22) Filed: Jun. 5, 2002

(65) Prior Publication Data

US 2003/0228526 A1 Dec. 11, 2003

(51) Int. Cl.[7] .................................................. G03F 9/00
(52) U.S. Cl. ......................................................... 430/5
(58) Field of Search ..................................... 430/5, 296

(56) References Cited

U.S. PATENT DOCUMENTS

| | | | | |
|---|---|---|---|---|
| 5,853,923 A | * | 12/1998 | Tzu ............................ | 430/5 |
| 5,888,678 A | * | 3/1999 | Tzu et al. ................... | 430/5 |
| 5,955,222 A | | 9/1999 | Hibbs et al. | |
| 6,093,507 A | * | 7/2000 | Tzu ............................ | 430/5 |
| 6,180,953 B1 | | 1/2001 | Smolinski | |

* cited by examiner

*Primary Examiner*—Saleha R. Mohamedulla
(74) *Attorney, Agent, or Firm*—DeLio & Peterson, LLC; John J. Tomaszewski; Todd M. C. Li

(57) ABSTRACT

A method and apparatus for making phase shift masks are provided wherein an anti-reflective coating used on an opaque pattern layer of the mask fully covers the opaque pattern layer and has not been etched in the etching process to form the phase shift mask. A two-exposure method to form the phase shift mask is used wherein a photoresist having a defined dose-to-clear level is coated on the surface of the mask and the lower surface of the mask is exposed to a blanket exposure in an energy amount less than the dose-to-clear level. The open areas of the upper surface of the mask to be etched are exposed to an energy dose in an amount less than the dose-to-clear level, with the sum of the amounts of the lower surface energy and upper surface energy being at least the dose-to-clear level. The method and apparatus minimizes and/or avoids etching of the anti-reflective coating.

4 Claims, 5 Drawing Sheets

SELF-ALIGNED ALTERNATING PHASE SHIFT MASK PATTERNING PROCESS

BACKGROUND OF THE INVENTION

1. Field of the Invention

This invention relates to a method and apparatus for making phase shift masks used in the manufacture of semiconductor microcircuits and other electronic components to transfer a circuit pattern onto a workpiece, and, in particular, to a self-aligned alternating phase shift mask wherein etching of an anti-reflective coating used on the opaque patterns of the mask is avoided.

2. Description of Related Art

In the manufacture of circuit patterns on electronic components such as the manufacture of integrated circuits on semiconductor substrates photomasks are used to transfer the desired circuit pattern onto the substrate workpiece. Typically, a photomask comprises a patterned metal film such as chromium, nickel or aluminum in a thickness of about 1,000 Å deposited on a transparent base such as glass or quartz. The photomask is generally manufactured by depositing a thin film of the metal on the surface of the transparent substrate, coating an anti-reflective coating on the metal, coating with a photoresist layer, exposing a pattern on the photoresist coating, developing the resist coating, and removing the metal from the unprotected areas of the film by etching leaving patterned metal film on the substrate. Mask blanks are typically purchased containing the metal film, anti-reflective coating and photoresist layer.

The pattern contained in the photomask is reproduced onto the surface of a workpiece typically by placing the mask over the workpiece and irradiating a radiation-sensitive resist material on the workpiece. The varieties of radiation sources for lithography that have been used or proposed for phase shift masks include visible light and ultraviolet light with optical wavelengths of 365 nm, 248 nm, 193 nm and 157 nm. When illuminated by the radiation, the metal pattern on the photomask serves to selectively block portions of the radiation beam while allowing other portions to be transmitted therethrough. In this manner, very complex geometries having very narrow line widths can be reproduced allowing the economical production of very large scale integrated circuits and other devices.

Optical photolithography has been widely used in the semiconductor industry in connection with the formation of a wide range of structures in integrated circuit (IC) chips. As the device density on IC chips has increased, the size of the structures making up the devices has approached the wave length (around 0.25 micron) of the light used in optical photolithography processes. Future structures approach 90 nm images with a 160 nm pitch (line & space) at 193 nm wavelength. Optical diffraction makes it difficult to form images smaller than the wavelength of light when conventional masks and illumination techniques are used. Future density increases in IC devices may be difficult to achieve absent the development of alternative lithographic technologies.

Phase-shift lithography was developed to enhance the resolution of conventional optical photolithography. Phase-shift lithography is based on opposite phase destructive interference of the waves of incident light. By shifting the phase of one region of the incident light waves 180°, relative to an adjacent region of incident light waves, a sharply defined dark zone is created in the projected image of the phase shift mask. This zone defines an interface with greater edge contrast than can be achieved in the interface between a clear area and an opaque absorber in a conventional mask. Such a phase shift mask is well-known in the art and is termed an alternating phase shift mask (altPSM). The alternating regions that are etched to 180° phase are defined by a write operation on the mask. To facilitate proper alignment of the mask pattern to the chrome-on-glass (COG) mask these phase patterns are slightly oversized.

The anti-reflective coating is used on the surface of the blocking (chrome) layer to reduce the scattering of stray light in the optical lithographic process. Stray light in the optical lithography process reduces image contrast by scattering into areas that should be dark. Unfortunately, during the quartz etching process to form the phase shift pattern, exposed portions of the anti-reflective coating resulting from the oversize write operation may become degraded and lost to the quartz etch. This is shown in FIGS. 2A–2E which show a prior art method for making a self-aligned alternating phase shift mask patterning process using a chrome-on-glass mask which is etched to form the phase shift pattern.

Referring to FIG. 2A, a COG mask is shown generally as 10 and comprises a transparent substrate 12, patterned chrome regions 13 on the surface of the substrate 12 and an anti-reflective coating 14 on the surface of each of the chrome regions 13. A photoresist 15 is shown overlying the coated chrome patterns 13 as well as the upper surface 12a of the substrate.

A write operation using an energy beam 18 is directed onto the resist 15 to form the regions 19 which are to be etched to form the 180° shift.

Referring to FIG. 2B, after exposure of the mask 10, portions 19 of the photoresist 15 were exposed corresponding to the write operation. It can be seen that the exposed areas 19 extend over the edge of the chrome pattern 13 and overlying anti-reflective coating 14. This is the conventional process used to form a slightly oversized opening in the fabrication of alternating phase shift masks.

In FIG. 2C, the exposed areas 19 are developed forming openings 20 in the resist layer 15. Again it can be seen that the openings 20 overlap the chrome pattern 13 and overlying anti-reflective coating 14.

In FIG. 2D the mask 10 is etched forming phase shift recesses 21 in the substrate 12. The recesses 21 are formed where there are openings 20 in the resist 15 formed from the imaging process. The recesses are formed typically to provide a 180° phase shift. It will be noted that part of the anti-reflective coating 14 is also etched as shown at 22 so that the remaining anti-reflective coating 14 does not cover the entire chrome pattern 13 surface. The remaining resist 15 is then removed leaving the final phase shift mask as shown in FIG. 2E. As can be seen, the anti-reflective coating 14 does not completely cover the chrome pattern design 13 and thus reduces the effectiveness of the mask when used to transfer the pattern onto a workpiece. In addition to causing more reflection in the lithography tools, the missing anti-reflective coating that is formed around every phase opening appears as a bright halo in the reflective image capture during mask inspection. The concept of the enlarged phase opening is to provide overlay insensitivity and this halo can be severely misaligned relative to the chrome pattern and cause inspection problems. Recesses 21 are formed to provide typically a 180° phase shift in the substrate 12.

Bearing in mind the problems and deficiencies of the prior art, it is an object of the present invention to provide a method and apparatus to make phase shift masks and, in particular, self-aligned alternating phase shift masks having an anti-reflective coating on the opaque patterns of the mask.

A further object of the present invention is to provide phase shift masks made by the method and apparatus of the invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for making a phase shift mask comprising the steps of:

supplying a transparent substrate mask having an upper surface and a lower surface wherein the upper surface has open regions, opaque pattern regions and an overlying coating on the opaque pattern regions, with the mask being ready for etching the open regions to form the phase shift mask;

applying a photoresist layer on the upper surface of the mask covering the open and opaque coated regions, the photoresist layer having a defined dose-to-clear exposure level;

exposing the lower surface of the mask with a lower surface energy source in an amount less than the dose-to-clear level thereby exposing all the open regions;

exposing the open regions of the upper surface of the mask which are to be etched to form the phase shift mask to an upper surface energy source in an amount less than the dose-to-clear exposure level and the sum of the amounts of the lower surface energy and upper surface energy being at least the dose-to-clear exposure level;

developing the exposed mask removing the resist from the open regions exposed to both the lower surface and upper surface energy sources; and etching the developed mask to form the desired phase shift mask.

The lower surface of the mask and the upper surface of the mask may be exposed in any order.

In a further aspect of the present invention the upper surface energy source partially overlaps the coated opaque regions of the transparent substrate mask.

In another aspect of the present invention alternating open regions of the transparent substrate are etched to form an alternating phase shift mask.

In a further aspect of the present invention, an apparatus is provided for making a phase shift mask comprising:

a holding device for holding a transparent substrate mask having an upper surface and a lower surface wherein the upper surface has open regions, opaque pattern regions and an overlying coating on the opaque regions, with the mask being ready for etching the open regions to form a phase shift mask;

application means for applying a photoresist layer on the upper surface of the mask covering the open and opaque coated regions, the photoresist layer having a defined dose-to-clear exposure level;

exposing means to expose the lower surface of the mask with an upper surface energy source in an amount less than the dose-to-clear exposure level thereby exposing all the open regions;

exposing means to expose the open regions of the upper surface of the mask which are to be etched to form the phase shift mask with an upper surface energy source in an amount less than the dose-to-clear exposure level and the sum of the amounts of the lower surface energy and the upper surface energy being at least the dose-to-clear exposure level;

developing means to develop the exposed mask to remove the resist from the open regions exposed to both the lower surface and upper surface energy sources; and etching means to etch the developed mask to form the desired phase shift mask.

In a further aspect of the present invention the upper surface source partially overlaps the corresponding coated opaque regions.

Phase shift masks made by the method and using the apparatus of the present invention are also provided herein.

In another aspect of the present invention a method is provided for making integrated circuit components such as chips comprising the steps of:

supplying an integrated circuit substrate containing a photoresist on the surface thereof;

positioning a mask having the desired circuit design over the substrate, the mask being made by the method of the invention as described above;

exposing the mask to light to expose the substrate in the desired circuit design;

developing the substrate to form the desired circuit pattern; and forming the desired circuit pattern on the substrate.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(s)

Figure 1A:
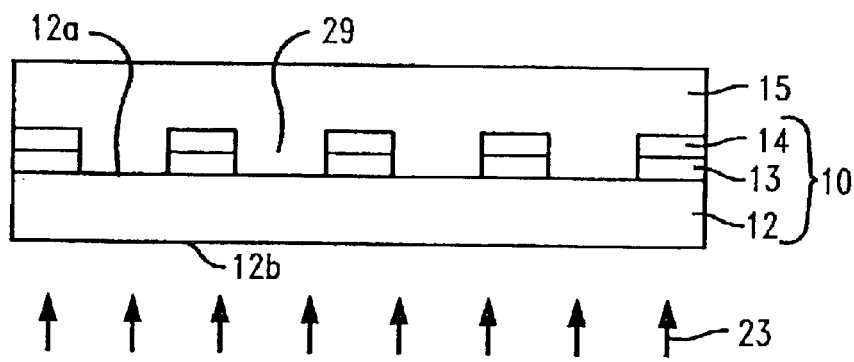
FIGS. 1A–1G show a method of the invention used to form a self-aligned alternating phase shift mask.

In describing the preferred embodiments of the present invention, reference will be made herein to FIGS. 1A–3 of the drawings in which like numerals refer to like features of the invention. Features of the invention are not necessarily shown to scale in the drawings.

The present invention is directed to making phase shift masks, and, in particular, to making alternating phase shift masks, which masks contain an anti-reflective coating on the opaque design layer of the mask. The invention minimizes and/or avoids etching of the anti-reflective coating during the mask making method. For convenience, the following description will be directed to chrome-plated quartz or glass substrate photomasks which, as noted above, typically comprise a metal pattern such as chromium in a thickness of about 1000 Å deposited on a transparent base such as glass or quartz.

The substrate of the mask is made from any material that will transmit electromagnetic radiation or other suitable actinic energy of the wave length used in a phase shift lithography and is typically silica or quartz. The thickness of the substrate will vary based on known design considerations and is typically about 2 to 9 mm with 6.35 mm being the most commonly used thickness.

The top surface of the substrate is partially covered with a patterned blocking layer made from a material that substantially blocks the transmission therethrough of electromagnetic or other radiation. Suitable materials include those that have mechanical durability and opacity in thin layers such as chromium, molybdenum, aluminum, and the like. Chromium is the preferred material due to its relatively high mechanical and chemical durability and because it is the preferred mask material in the industry. The thickness of the blocking layer will vary as a function of the properties of the material used as the layer to block the transmission of (strikethrough; phase shift) radiation and is typically about 500 Å to 1200 Å thickness for a chromium layer.

It is well known how to make a chrome-on-glass (COG) mask. The making of the COG mask before etching of the substrate to form the phase shift region is conventional and portions of the chrome layer to form the desired pattern are removed using known masking and etching techniques such as reactive ion etching in a chlorine and oxygen ambient or a wet etch technique to form a plurality of openings in the chrome layer. An anti-reflective coating is deposited on the surface of the chrome before patterning and any of the known anti-reflective coatings known in the art may be used. A typical coating is chromium oxide or chromium oxynitride at a thickness of 100 Å A to 600 Å.

Referring now to FIGS. 1A–1G, the method and apparatus of the invention may be described.

In FIG. 1A a chrome-on-glass mask is shown generally in composite as 10 and comprises a transparent substrate 12 and chrome patterns 13 having an overlying anti-reflective coating 14. The mask 10 has an upper surface 12a and a lower surface 12b and open areas between the chrome patterns 13 shown as 29. A photoresist 15 is shown covering the mask including the chrome patterns 13 and anti-reflective coating layers 14 as well as the open areas 29 of the upper surface 12a of substrate 12. An energy source shown by arrows 23 is shown directed at the lower surface 12b of the substrate 12. This is a blanket exposure and exposes the complete lower surface 12b of substrate 12.

Figure 1B:
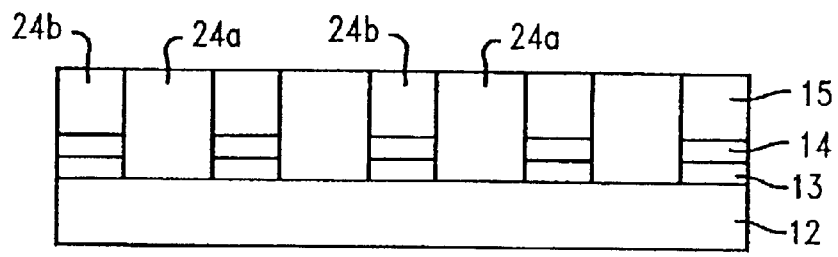

FIG. 1B shows the results of exposing the mask 10 to energy source 23. Alternating exposed areas 24a have been exposed to the energy source 23. The unexposed alternating regions 24b of photoresist 15 remain in the same condition as before the blanket exposure by energy source 23. It is an important feature of the invention that the exposure by energy source 23 be at a level of less than the dose-to-clear exposure level of the resist 15. In other words, the exposed areas 24a are not exposed to the full energy necessary so that upon developing areas 24a would not be removed. The exposed areas 24a will typically be exposed at a level of about 50% of the dose-to-clear exposure level and may be exposed at a level of about 40 to 70% of the dose-to-clear exposure level.

Figure 1C:
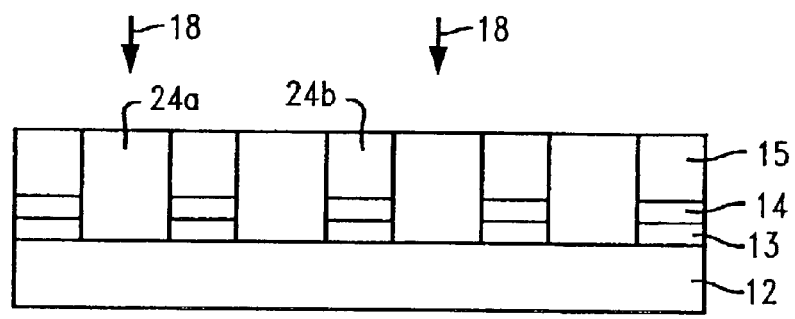

Referring now to FIG. 1C, the exposed COG mask of FIG. 1B is now further exposed to energy source 18 by a direct write at open areas defining the areas of the mask 10 which are to be etched to form the alternating phase shift mask of the invention. The direct write energy 18 is directed slightly larger than the openings 29 between the chrome patterns 13, which slightly larger openings are used to form a self-aligning phase shift mask as is well known in the art. Thus, the partially exposed mask of FIG. 1B is now exposed in FIG. 1C to energy source 18 at a level which is below the dose-to-clear exposure level of resist 15 but in an amount sufficient so that the exposure dose of energy source 18 plus the exposure dose of energy source 23 exceeds the dose-to-clear exposure level of resist 15.

Figure 1D:
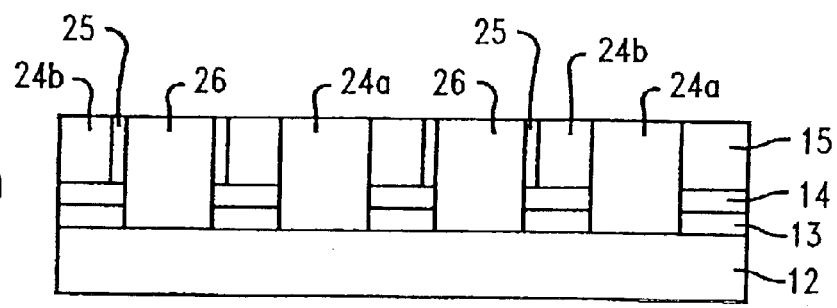

FIG. 1D shows the COG mask 10 now exposed through both energy sources 23 and 18. Exposed areas 26 have now been exposed to at least the dose-to-clear exposure level required for developing the resist 15 and preferably in a dose-to-clear exposure level above about 100–150% of the level. Regions 25 refer to those portions of the resist that have been exposed only to energy source 18 which, as noted above, will be less than the dose-to-clear exposure level. Other regions not exposed to energy source 18 or blanket energy source 23 remain as unexposed resist regions 24b. Partially exposed areas 24a remain as partially exposed areas since they were not exposed to energy source 18.

Figure 1E:
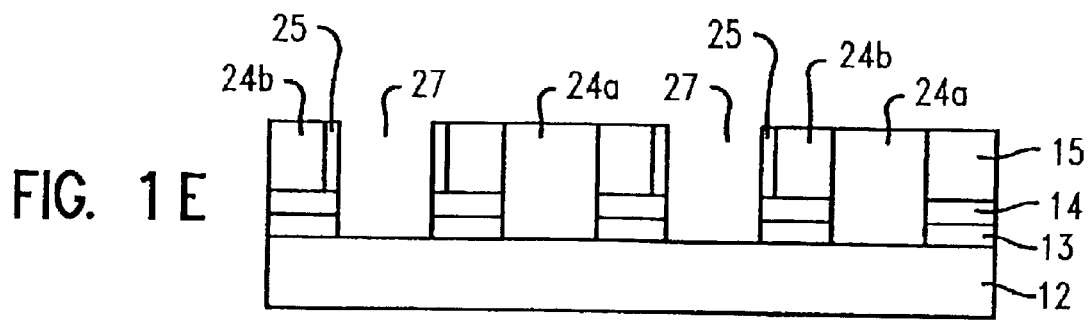

In FIG. 1E the mask is now shown after developing so that fully exposed regions 26 are removed by the developing and form open areas 27 in the mask. Unexposed resist 24b still remains on the mask as well as partially exposed regions 24a and 25.

Figure 1F:
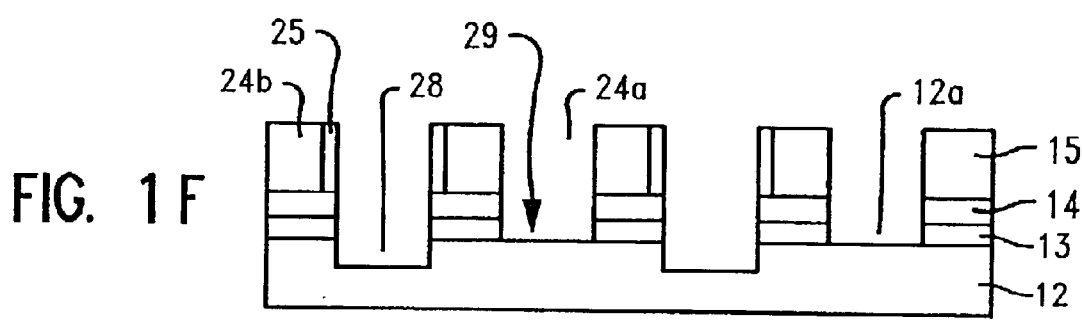

FIG. 1F shows the mask after etching to form recessed areas 28 corresponding to the etching required to form the desired alternating phase shift mask. Preferably, the substrate 12 is etched to a level to form a thickness so that light transmitted through the mask will be phase shifted 180° compared to the adjacent open area 29 which have not been etched and which will transmit energy or light which is not phase shifted.

Figure 1G:
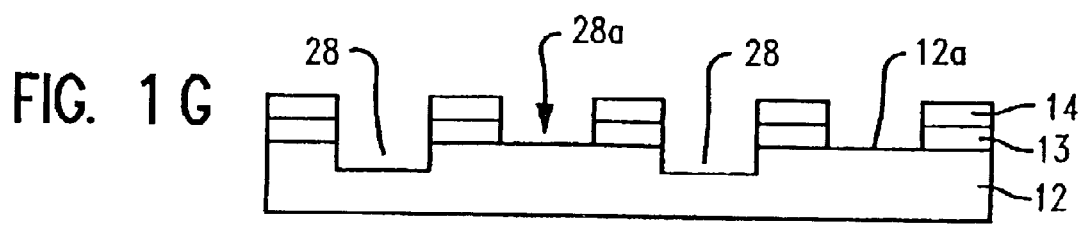
Figure 2A:
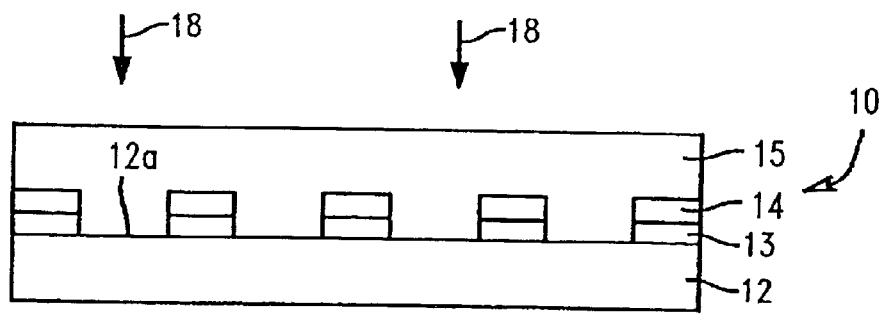
FIGS. 2A–2E show a method of the prior art for making a self-aligned alternating phase shift mask wherein part of the anti-reflective coating is etched from the opaque design pattern on the mask.
Figure 2B:
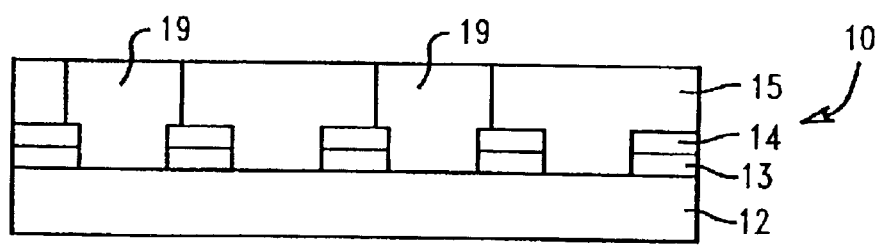
Figure 2C:
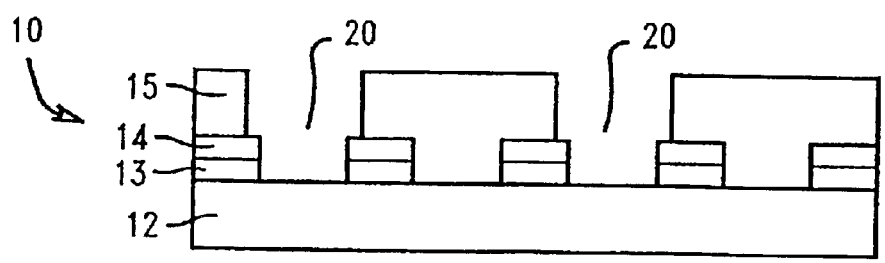
Figure 2D:
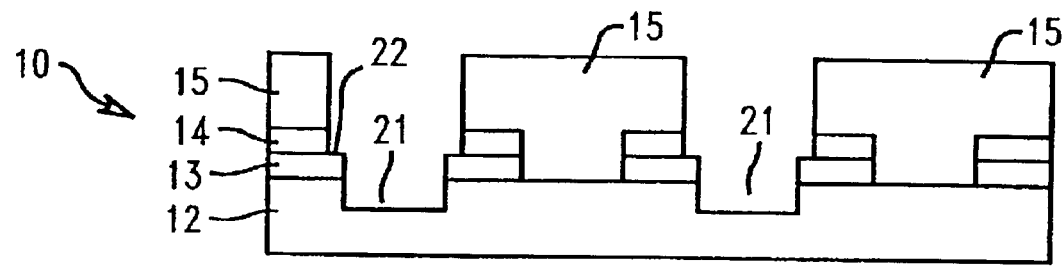
Figure 2E:
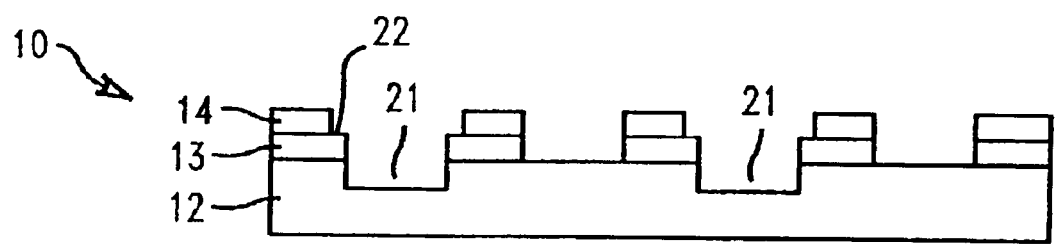

FIG. 1G shows the finished mask after the unexposed resist 24b and the partially exposed resists 24a and 25 are removed. Thus, the mask contains alternating recessed areas 28 and alternating unetched areas shown as 28a forming the alternating phase shift mask.

It is to be noted that the anti-reflective coating 14 fully covers the chrome pattern 13 so that the full effect of the anti-reflective coating is obtained when the mask is used in the fabrication of electronic components. This mask is to be contrasted with the mask of the prior art shown in FIG. 2E wherein the anti-reflective coating 14 has been partially etched away as shown by region 22.

Figure 3:
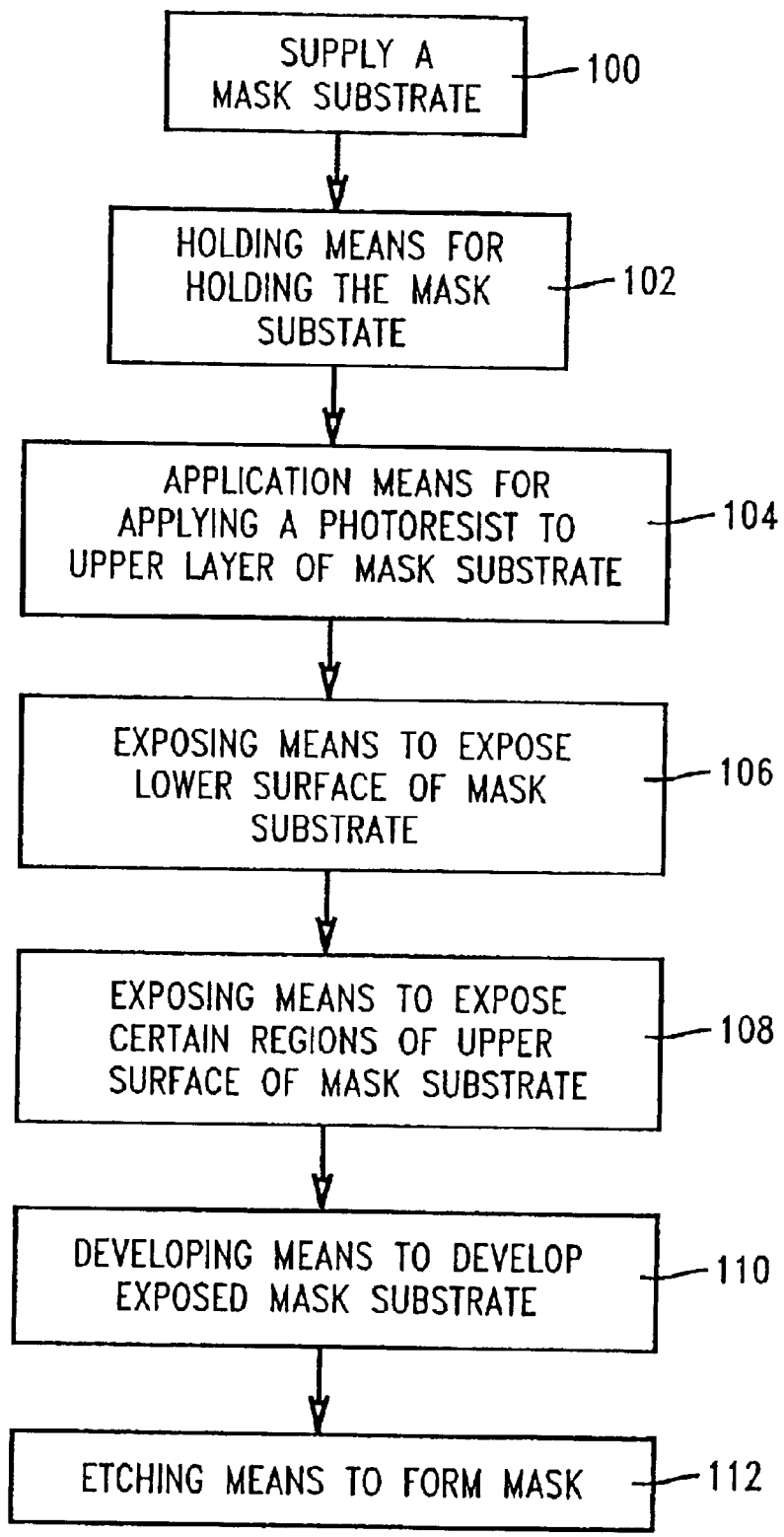
FIG. 3 shows a flow sheet to make a mask using an apparatus of the invention.

Referring now to FIG. 3, this figure shows a flow chart to make a mask using an apparatus of the invention. In step 100, a transparent mask substrate having open and opaque regions is supplied. In step 102, holding means are used to hold the transparent mask substrate. In step 104 application means are used to apply a photoresist to the upper surface of the mask covering the open and opaque coated regions. In step 106, the lower surface of the transparent mask substrate is exposed to a lower surface energy source in an amount less than the dose-to-clear exposure level thereby exposing all the open regions of the transparent mask substrate. In step 108 an upper surface exposing means is used to expose the open regions of the upper surface of the mask which are to be etched to form the phase shift mask with an upper surface energy source in an amount less than the dose-to-clear exposure level. The sum of the amounts of the lower surface energy and upper surface energy is at least the dose-to-clear exposure level. Typically, a direct write apparatus will be used to expose the transparent substrate to the upper surface energy source as is well known in the art. In step 110, developing means are used to develop the exposed mask to remove the resist from the open regions exposed to both the lower surface and upper surface energy sources. Etching means are then used in step 112 to etch the developed mask to form the desired phase shift mask.

In the aspect of the invention directed to a method for making integrated circuit components such as chips comprising a series of steps, it will be appreciated by those skilled in the art that the steps are conventional except for the mask used to form the circuit pattern on the substrate. The steps of supplying an integrated circuit substrate containing a photoresist, positioning the substrate, exposing the mask to light to expose the substrate in the desired circuit design, developing a substrate and forming the desired circuit pattern are well-known in the art. The inventive step is to employ the mask of the invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for making a phase shift mask comprising the steps of:

supplying a transparent substrate mask having an upper surface and a lower surface wherein the upper surface has open regions, opaque pattern regions and an overlying coating on the opaque pattern regions, with the mask being ready for etching the open regions to form the phase shift mask;

applying a photoresist layer on the upper surface of the mask covering the open and opaque coated regions, the photoresist layer having a defined dose-to-clear exposure level;

exposing the lower surface of the mask with a blanket exposure lower surface energy source in an amount less than the dose-to-clear level thereby exposing all the open regions;

exposing the open regions of the upper surface of the mask which are to be etched to form the phase shift mask to an upper surface energy source in an amount less than the dose-to-clear exposure level and the sum of the amounts of the lower surface energy and the upper surface energy being at least the dose-to-clear exposure level;

developing the exposed mask removing the resist from the open regions exposed to both the lower and upper surface energy sources leaving the resist in those open regions and opaque pattern regions not exposed to both the lower surface energy source and the upper surface energy source; and etching the developed mask to form the desired phase shift mask.

2. The method of claim 1 wherein the upper surface energy source is provided using a direct write process.

3. The method of claim 2 wherein the upper surface energy source partially overlaps the coated opaque regions of the transparent substrate mask.

4. The method of claim 3 wherein alternating open regions of the transparent mask substrate are exposed to both the lower surface and upper surface energy sources.

* * * * *